United States Patent
Cabret et al.

(10) Patent No.: US 10,401,395 B2
(45) Date of Patent: Sep. 3, 2019

(54) MONITORING A LINEAR VARIABLE DIFFERENTIAL TRANSFORMER SENSOR

(71) Applicant: SAFRAN AIRCRAFT ENGINES, Paris (FR)

(72) Inventors: Vincent Cabret, Paris (FR); Cedrik Djelassi, Marolles en Hurepoix (FR)

(73) Assignee: SAFRAN AIRCRAFT ENGINES, Paris (FR)

( * ) Notice: Subject to any disclaimer, the term of this patent is extended or adjusted under 35 U.S.C. 154(b) by 996 days.

(21) Appl. No.: 14/409,091

(22) PCT Filed: Jun. 24, 2013

(86) PCT No.: PCT/FR2013/051466
§ 371 (c)(1),
(2) Date: Dec. 18, 2014

(87) PCT Pub. No.: WO2014/001698
PCT Pub. Date: Jan. 3, 2014

(65) Prior Publication Data
US 2015/0142353 A1  May 21, 2015

(30) Foreign Application Priority Data
Jun. 25, 2012  (FR) ...................... 12 55996

(51) Int. Cl.
| | | |
|---|---|---|
| *G01R 17/00* | (2006.01) | |
| *G01D 5/22* | (2006.01) | |
| *G01D 18/00* | (2006.01) | |
| *G01R 19/00* | (2006.01) | |

(52) U.S. Cl.
CPC ........... *G01R 17/00* (2013.01); *G01D 5/2291* (2013.01); *G01D 18/00* (2013.01); *G01R 19/0084* (2013.01)

(58) Field of Classification Search
CPC .. G01D 5/2291; G01D 18/00; G01R 19/0084; G01R 17/00
USPC .......................................................... 702/64
See application file for complete search history.

(56) References Cited

U.S. PATENT DOCUMENTS

| | | |
|---|---|---|
| 7,138,794 B1 | 11/2006 | Cook et al. |
| 2014/0360255 A1 | 12/2014 | Javelot et al. |

FOREIGN PATENT DOCUMENTS

| | | |
|---|---|---|
| DE | 100 36 935 | 2/2002 |
| EP | 1 132 718 | 9/2001 |

OTHER PUBLICATIONS

Hof, Andreas. Machine translation of DE10036935A1.*
(Continued)

*Primary Examiner* — Yoshihisa Ishizuka
(74) *Attorney, Agent, or Firm* — Oblon, McClelland, Maier & Neustadt, L.L.P.

(57) ABSTRACT

A method for monitoring an LVDT sensor including two secondary circuits, the method including: calculating the difference between voltages at terminals of one of the secondary circuits at a given instant and at a previous instant; calculating the difference between voltages at terminals of the other one of the secondary circuits at the given instant and at the previous instant; calculating the sum of the two differences calculated; modifying an indicator according to a distance to zero of the previously calculated sum; and comparing the indicator with at least one predetermined threshold.

7 Claims, 5 Drawing Sheets

(56) References Cited

OTHER PUBLICATIONS

International Search Report dated Jan. 7, 2014, in PCT/FR13/051466 filed Jun. 24, 2013.
French Search Report dated Apr. 2, 2013 in French Patent Application No. 1255996 filed Jun. 25, 2012.
U.S. Appl. No. 14/441,065, filed May 6, 2015, Gaully, et al.
U.S. Appl. No. 14/299,392, filed Jun. 9, 2014, 2014-0360255, Javelot, et al.
U.S. Appl. No. 14/409,091, filed Dec. 18, 2014, Cabret, et al.

* cited by examiner

MONITORING A LINEAR VARIABLE DIFFERENTIAL TRANSFORMER SENSOR

TECHNICAL FIELD

The present invention concerns in general terms the monitoring of a measuring chain, for example for an aircraft engine. It concerns more particularly the monitoring of intermittent contacts that may affect sensors of the linear variable differential transformer (LVDT) type of the measuring chain.

PRIOR ART

A measuring chain, for example for an aircraft engine, comprises LVDT sensors that are inductive electrical sensors for linear movements. LVDT sensors are in particular used for the positional control of variable stator vanes (VSVs), variable bleed valves VBV or fuel meters. LVDT sensors are also used for high pressure turbine clearance control (HPTCC).

Figure 1:
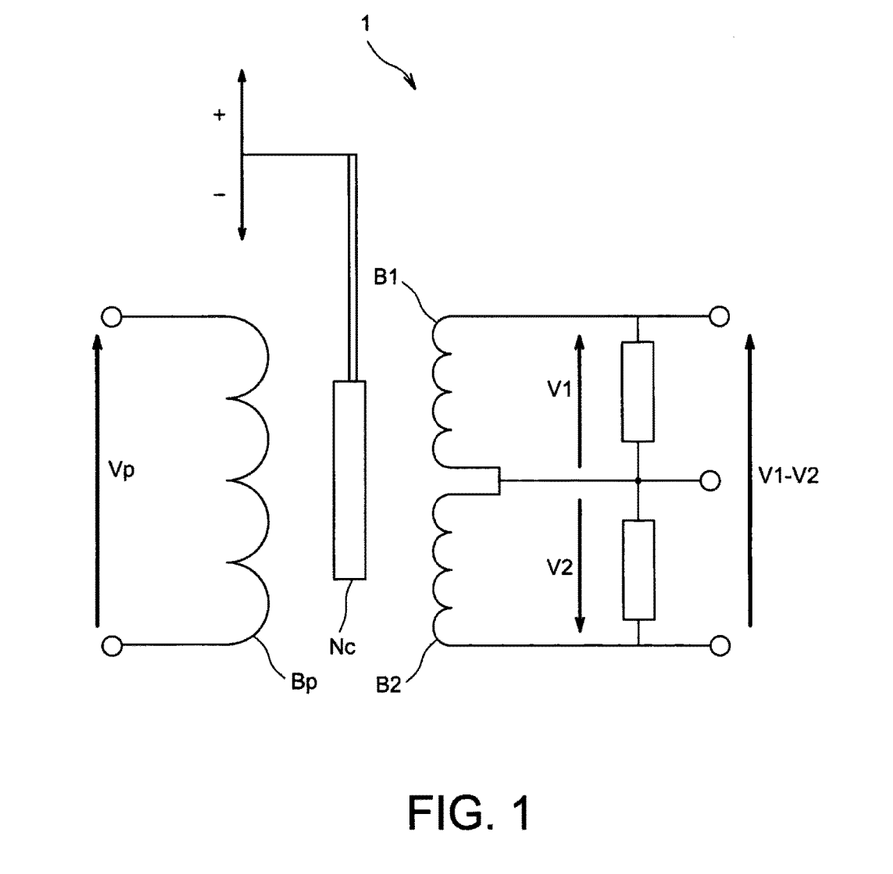
FIG. 1 shows an LVDT sensor.

With reference to FIG. 1, an LVDT sensor 1 comprises a transformer that itself comprises a primary circuit formed by a coil Bp and two secondary circuits each formed by a coil B1, B2. These three coils are cylindrical and coaxial. When the primary coil Bp is supplied by a voltage Vp, for example sinusoidal, a secondary voltage V1, V2 exists at the terminals of each of the secondary coils B1 and B2.

The LVDT sensor 1 also comprises a central core NC able to move along the axis of the coils. The movement of the core causes a modification to the magnetic fields inside the transformer. More precisely, when the core is moved from a central position, the voltage induced in one of the secondary coils increases and the voltage induced in the other secondary coil decreases. This produces a differential output voltage (V1−V2) that varies linearly according to the position of the core.

The LVDT sensor 1 can function in differential mode and its output is then the differential voltage (V1−V2), or in differential on sum mode and its output is then the difference in voltages of the two secondary circuits related to their sum (V1−V2)/(V1+V2).

Figure 2A:
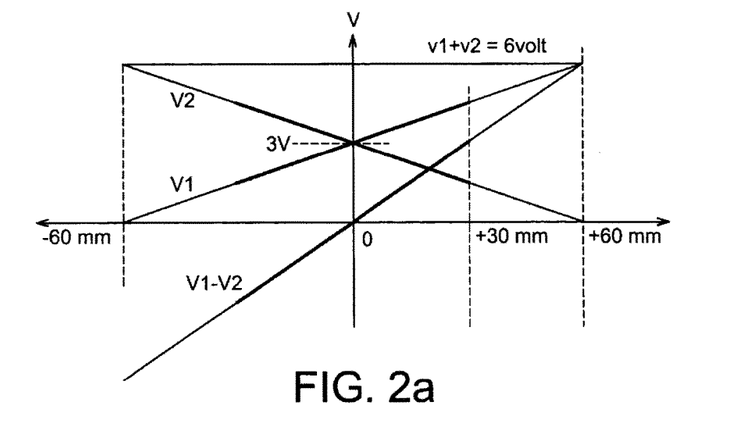
FIG. 2a shows the secondary voltages of the LVDT sensor according to a movement.

FIG. 2a depicts the variation in the voltages V1 and V2 at the terminals of each of the two secondary coils B1 and B2 and the variation in the differential voltage (V1−V2) at the terminals of both of the two coils, according to the movement of the central coil NC.

Figure 2B:
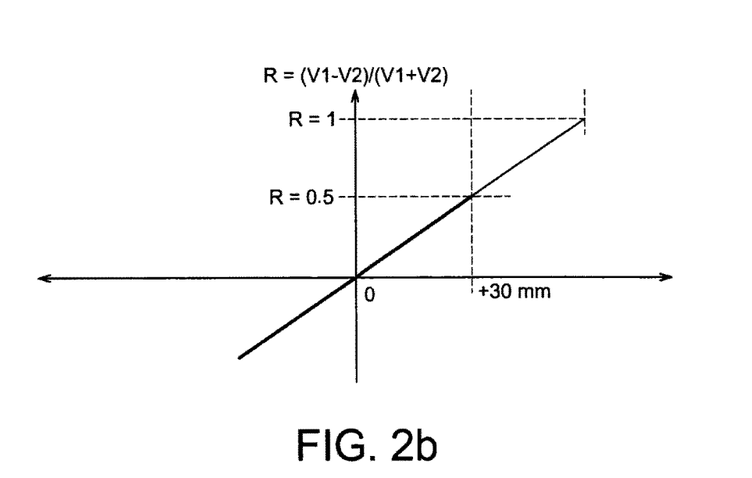
FIG. 2b shows the differential tension divided by the sum of the secondary tensions, according to a movement.

FIG. 2b shows the variation in the ratio R of the differential voltage in relation to the sum of the secondary voltages (V1−V2)/(V1+V2), according to the movement of the central core NC.

Such a measuring chain functions in an environment in which there exist strong thermal and vibratory stresses. These stresses frequently cause faults of the intermittent contact type. An intermittent contact is an intermittent and very brief opening of the electrical circuit or an unwanted earthing.

When intermittent contacts occur on one of the secondary coils, the voltage measured at the terminals of this coil is chopped. After rectification, the RMS value obtained, which can be used by the computer, takes abnormally low values and changes erratically according to the density of microcutoffs. Consequently the position calculated from measurements supplied by the LVDT sensor is erratic and affected by high or low peaks, depending on the location of the fault on one or other of the coils.

There also exist intermittent contacts through earthing, which is common to the two secondary coils. In this case, the voltages measured at the terminals of the two secondary coils are affected by the fault and are erratically low.

It is known that a computer analyses the data input in order to verify their validity. For this purpose the computer can use three main types of test.

The first type is that of electrical integrity tests. These tests were applied to the voltage measurements at the terminals of the secondary coils of the LVDT sensor.

A first electrical integrity test is the check that the voltage measurements at the terminals of secondary coils lie within a predetermined range, which makes it possible to detect a clear open circuit and a short-circuit, that is to say a "clear" breakdown. However, this test is not designed to detect an intermittent open circuit since in this case the voltages measured remain within the predetermined range.

A second electrical integrity test is the check that the sum of the voltage measurements at the terminals of the secondary coils lies between a minimum value and a maximum value. This is because the LVDT sensor has the property that the sum of the secondary voltages is almost constant whatever the position of the movable core. This test makes it possible to detect electrical drifts caused by insulation defects. This test is however not satisfactory in the case of intermittent contact.

This is because monitoring the sum of the voltage measurements at the terminals of the secondary coils must be done within a fairly wide range of values in order to take into account any imperfections in the supply source (amplitude or frequency of the excitation signal) that are not faults. In other words, the range defined by the maximum value and the minimum value is wide so that it is possible that the sum of the voltages may fluctuate because of intermittent contacts without departing from the range. The fault is then not detected.

In addition, when this test detects an intermittent fault, the sum of the voltage measurements may depart from the validity range briefly and then return to the validity range, etc. There is therefore intermittent detection, the consequence of which is that the position measurement selected alternates between an erroneous value (when the computer does not detect a fault) and a safe reconfiguration value (when the computer detects a fault), which destabilises the system.

The second type of test is a likelihood test (or range or zone test). This test is applied to the position computed from the two secondary voltages of the LVDT sensor. The computer position is compared with a minimum threshold and a maximum threshold. This type of test therefore detects only aberrant positions and does not detect small oscillations.

The third type of test is a difference test. When the previous two types of test have not detected any problems on the measurements of the LVDT sensor, the position of the movable core can be determined. However, there are always two redundant LVDT sensors and it is therefore possible to check that the determined position is consistent with that determined from a second redundant LVDT sensor. Where the two determined positions are different from each other, this means that at least one of these measurements is erroneous. However, detecting a difference between the measurements does not make it possible to locate which of the two sensors is faulty.

Thus it appears that the known validity tests are not satisfactory in the case of intermittent contact.

DISCLOSURE OF THE INVENTION

The invention aims to solve the problems of the prior art by providing a method for monitoring a sensor of the linear variable differential transformer type comprising two secondary circuits in which there is respectively induced a voltage varying linearly according to the movement of a core, characterised in that it comprises the iterative steps of:
- calculating the difference between the voltages at the terminals of one of the secondary circuits at a given instant and at a previous instant,
- calculating the difference between the voltages at the terminals of the other one of the secondary circuits at the given instant and at the previous instant,
- calculating the sum of the two differences previously calculated,
- modifying the value of an indicator according to the distance to zero of the previously calculated sum, and
- comparing the indicator with at least one predetermined threshold.

By means of the invention, a fault of the intermittent contact type is detected and the aberrant values are identified and can be suppressed by any subsequent treatment, such as a regulation.

The invention applies directly to the voltage measurements from a single sensor. The problem of location of the faulty sensor is then eliminated since the sensor can be self-tested.

The calculated sum is close to zero when the sensor is functioning normally and moves away from zero in the case of intermittent contact. Thus the value of the indicator changes according to the normal functioning of the sensor or the existence of intermittent contact.

The indicator keeps in memory a history of the variations in the measured voltages and enables "non-intermittent" detection of an intermittent fault.

According to a preferred feature, the indicator varies between two terminals, one of which indicates that the sensor is functioning normally and the other one of which indicates that the sensor is faulty.

According to a preferred feature, the modification of the indicator comprises an incrementation of the indicator if the sum is close to zero and a decrementation of the indicator if the sum is distant from zero. Thus the indicator increases in the case of normal functioning of the sensor and decreases in the case of intermittent contact.

According to a preferred feature, the comparison of the indicator comprises the comparison with a first threshold and a second threshold, so that the change from a normal functioning state to a fault state is made for a value different from that of the reverse change.

Thus a hysteresis phenomenon is created, which avoids declaring a sensor faulty intermittently.

The invention also concerns a device for monitoring a sensor of the linear variable differential transformer type comprising two secondary circuits in which there is respectively induced a voltage varying linearly according to the movement of a core, characterised in that it comprises:
- a means for calculating the difference between the voltages at the terminals of one of the secondary circuits at a given instant and at a previous instant,
- a means for calculating the difference between the voltages at the terminals of the other one of the secondary circuits at the given instant and at the previous instant,
- a means for calculating the sum of the two differences previously calculated,
- a means for modifying an indicator according to the distance to zero of the previously calculated sum, and
- a means of comparing the indicator with at least one predetermined threshold.

The invention also concerns a measuring chain integrating a sensor of the linear variable differential transformer type, comprising two secondary circuits in which there is respectively induced a voltage varying linearly according to the movement of a core, and a monitoring device as previously presented.

The device and the measuring chain according to the invention have advantages similar to those previously presented.

In a particular embodiment, the steps of the method according to the invention are implemented by computer program instructions.

Consequently the invention also relates to a computer program on an information carrier, this program being able to be implemented in a computer, this program comprising instructions suitable for implementing the steps of a method as described above.

This program can use any programming language and be in the form of a source code, object code or intermediate code between source code and object code, such as in a partially compiled form, or in any other desirable form.

The invention also relates to an information carrier that can be read by a computer and containing computer program instructions.

The information carrier may be any entity or device capable of storing the program. For example, the carrier may comprise a storage means, such as a ROM, for example a CD ROM or a microelectronic circuit ROM, or a magnetic recording means, for example a diskette or hard disk.

Moreover, the information carrier may be a transmissible carrier such as an electrical or optical signal, which can be routed via an electric or optical cable, by radio or by other means. The program according to the invention may in particular be downloaded on a network of the Internet type.

Alternatively, the information carrier may be an integrated circuit in which the program is incorporated, the circuit being suitable for executing or being used in the execution of the method according to the invention.

BRIEF DESCRIPTION OF THE DRAWINGS

Other features and advantages will emerge from a reading of a preferred embodiment given by way of non-limitative example, described with reference to the figures, in which.

DETAILED DISCLOSURE OF PARTICULAR EMBODIMENTS

Figure 3:
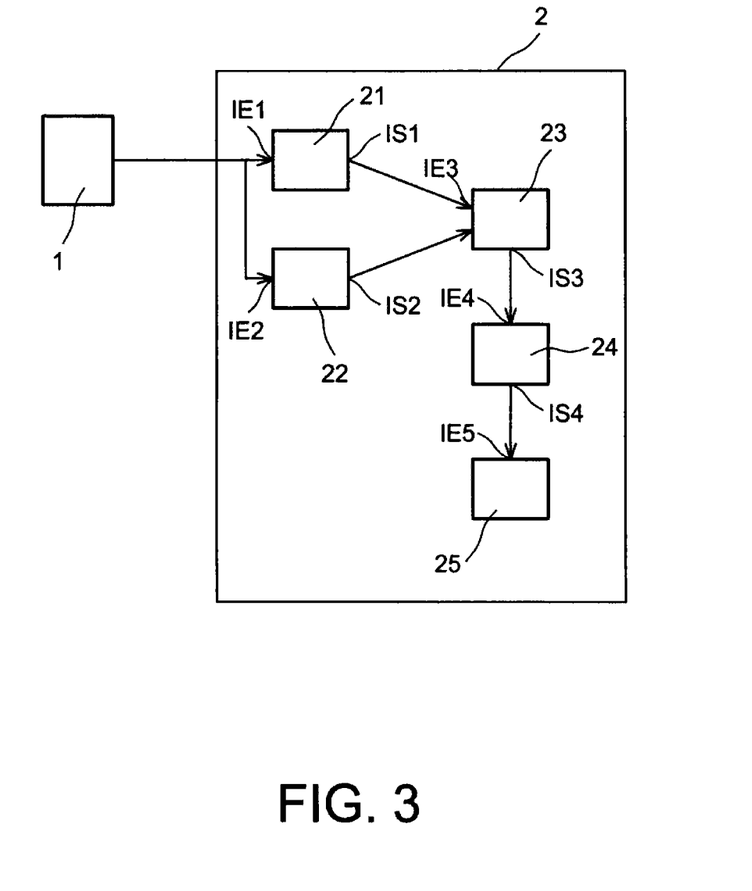
FIG. 3 shows an embodiment of the device according to the invention.

FIGS. 1, 2a and 2b have already been described.
FIG. 3 depicts schematically a measuring chain, for example for an aircraft engine or turbojet. The measuring chain comprises, in general terms, two redundant channels intended to collect, over time, physical measurements such as temperatures, pressures, positions, etc.

These physical measurements are performed via a set of sensors, only one LVDT sensor 1 of which is depicted in FIG. 3. The LVDT sensor is connected to a computer 2, for example a FADEC, which uses the measurements supplied by the sensors. These measurements are made at a given frequency. The voltages respectively measured at the terminals of the secondary coils B1 and B2, at a given instant, are denoted $V1_t$ and $V2_t$. These measured values are stored in an internal memory of the computer or in a memory associated therewith.

According to the invention, a device for monitoring the LVDT sensor 1 is associated with the computer 2 or integrated therein. In both cases, the device monitoring the LVDT sensor has the general structure of a computer. According to the embodiment depicted in FIG. 3, the device monitoring the LVDT sensor 1 is integrated in the computer 2. Only the features directly related to the invention are depicted and described, the other features of the computer being well known to persons skilled in the art.

The monitoring device comprises an input interface IE1 connected to a module 21 for computing the difference between the voltages at the terminals of one of the secondary circuits at a given instant t and at a previous instant (t−1). For example, the module 21 calculates the difference: $\Delta 1_t = V1_t - V1_{t-1}$.

The monitoring device also comprises an input interface IE2 connected to a module 22 for calculating the difference between the voltages at the terminals of the other one of the secondary circuits at the given instant t and at the previous instant (t−1). For example, the module 22 calculates the difference: $\Delta 2_t = V2_t - V2_{t-1}$.

For the above two voltage difference calculations, the time step is for example 15 ms.

These two computing modules can be implemented in a single module. They comprise a respective output interface IS1, IS2 connected to an input interface IE3 of a module 23 for computing the sum of the two differences previously calculated:

$$S_t = \Delta 1_t + \Delta 2_t$$

In theory, the sum $S_t$ is strictly equal to zero since a movement of the movable core causes an increase or respectively a decrease in the voltage at the terminals of one of the secondary coils, and simultaneously a decrease or respectively increase in the voltage at the terminals of the other one of the secondary coils, which are equal in absolute value.

In practice, there exist imperfections that mean that the voltages measured do not vary strictly linearly according to the position of the core. To dispense with these imperfections, if the sum $S_t$ remains in a range of values close to zero, the functioning of the sensor is considered to be normal. The terminals of this range are close to zero and can be determined experimentally.

This module 23 comprises an output interface IS3 that is connected to an input interface IS4 of a module 24 for updating a health indicator IND, the function of which is to indicate a fault.

The indicator IND varies between two terminals, for example 0 and 100. One of the values, the value 100, indicates that the sensor is functioning normally, and the other value, the value 0 indicates that the sensor is faulty.

The module 24 varies the value of the indicator IND between its terminals, according to the value of the sum $S_t$ supplied by the module 23. More precisely, the updating of the indicator comprises a modification to the value of the indicator according to the distance to zero of the sum previously calculated.

This sum is close to zero when the sensor functions normally and moves away from zero in the case of intermittent contact. Thus the value of the indicator changes according to the normal functioning of the sensor or the existence of intermittent contact.

The indicator IND is initialised to the value 100. The indicator IND is highly decremented if the sum $S_t$ indicates a fault of the intermittent type, that is to say if the sum $S_t$ is far from zero. The indicator IND is weakly incremented if the sum $S_t$ indicates a normal functioning of the sensor, that is to say if the sum $S_t$ is close to zero.

Figure 4:
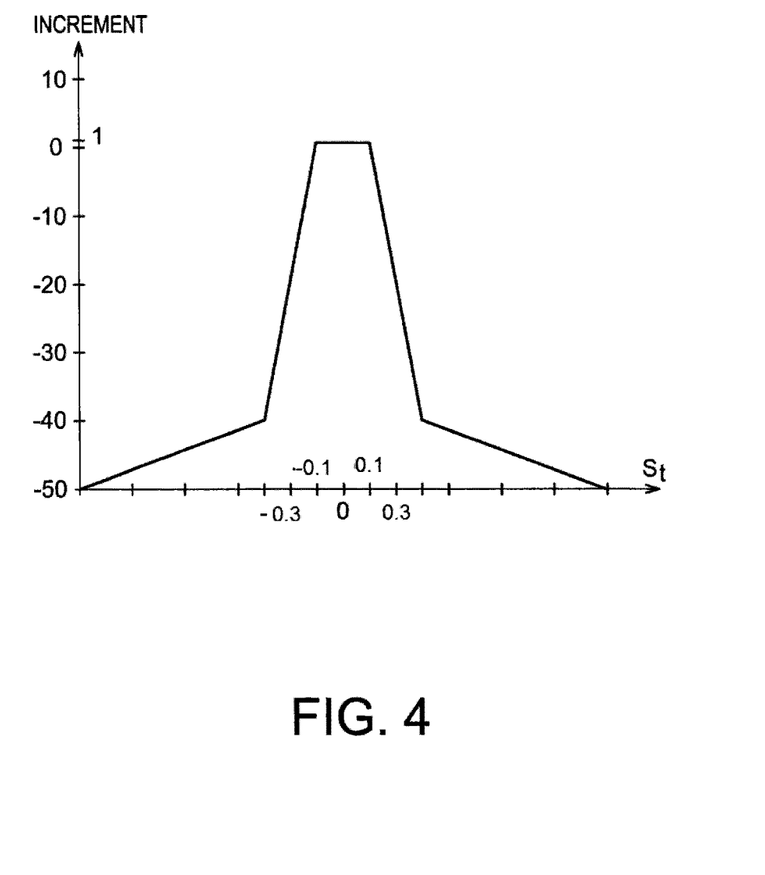
FIG. 4 shows an incrementation law for an indicator according to the invention.

For example, the indicator IND is incremented in accordance with an increment as depicted in FIG. 4.

For a sum $S_t$ of between −0.1 and +0.1, the increment is equal to 1.

For a sum $S_t$ of between +0.1 and +0.3 or between −0.1 and −0.3, the increment decreases linearly from 1 to −40.

For a sum $S_t$ of between +0.3 and +1 or between −0.3 and −1, the increment decreases linearly from −40 to −50.

The increment is applied to the indicator IND, while keeping the latter between its terminals, that is to say the increment is not applied, or is only partially applied, if the indicator arrives at one of its terminals.

It should also be noted that the indicator IND may be fixed when it reaches zero. It is considered in this case that the sensor is too degraded. Even if the intermittence of contact is subsequently attenuated, the sensor cannot be redeclared valid once again. In other words, fixing the indicator at zero prevents any rehabilitation of the LVDT sensor.

Naturally other variation laws for incrementing the indicator IND as a function of the sum $S_t$ are possible. The curve may be composed of linear segments in greater or smaller number. The curve may also be a bell curve or a Gaussian one.

The module 24 comprises an output interface IS4 that is connected to an input interface IE5 of a module 25 for determining a validity status of the sensor. This determination is based on the comparison of the indicator IND with at least one predetermined threshold.

Preferably, the comparison of the indicator comprises the comparison with a first threshold and a second threshold, so that the change from a normal operating state to a fault state is done for a value different from that of the reverse change.

The indicator IND being initialised to 100, if it then remains above a first threshold, referred to as the low threshold, equaling for example 50, the sensor is declared to be functioning normally. If the indicator IND becomes less than the first threshold, a fault of the intermittent contact type of the sensor is detected.

The indicator IND being below the first threshold, if it then remains below a second threshold, referred to as the high threshold, higher than the first threshold, equaling for example 90, the sensor remains declared faulty. If the indicator IND becomes greater than the second threshold, then the sensor is declared to be functioning normally.

This functioning in hysteresis makes it possible to avoid detecting a fault intermittently. Naturally, in a simplified mode, it is possible to use only one threshold, or in other words to choose a low threshold and a high threshold equal to each other.

Naturally the monitoring device may monitor a plurality of LVDT sensors included in the measuring chain.

Figure 5:
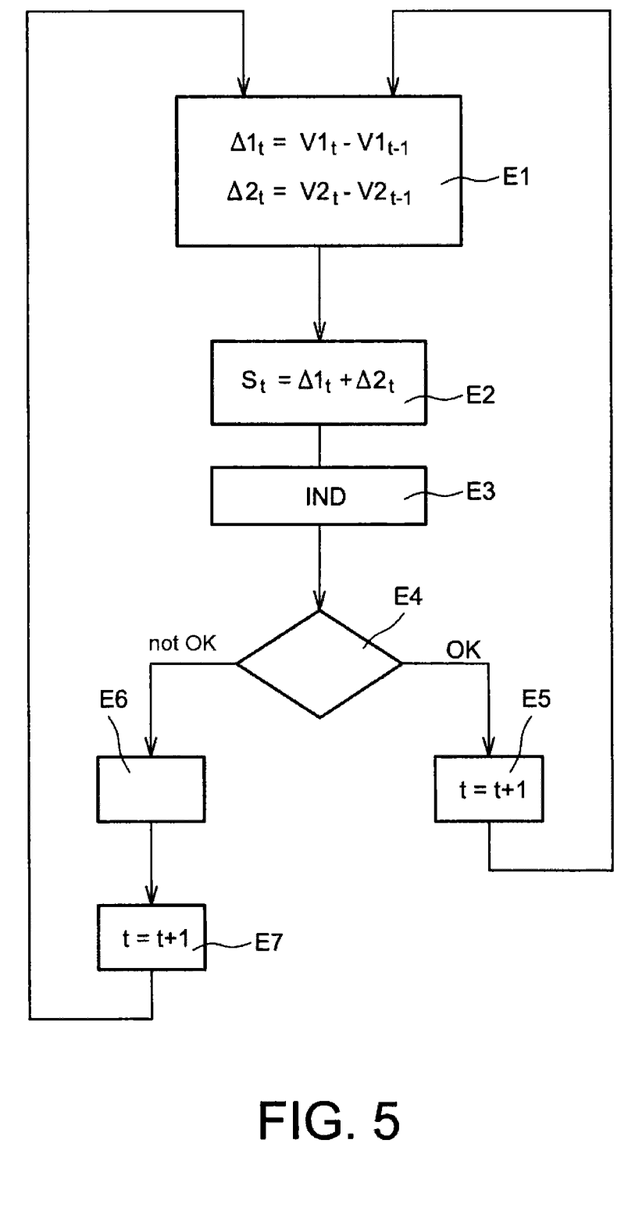
FIG. 5 shows an embodiment of the method according to the invention, in the form of a flow diagram.

The functioning of the LVDT sensor monitoring device is described with reference to FIG. 5, in the form of a flow diagram comprising steps E1 to E7.

Steps E1 to E7 are performed iteratively, for example at a predetermined frequency corresponding to the measurement frequency of the voltages V1 and V2 of the LVDT sensor. The time step is for example 15 ms.

Step E1 is the calculation of a difference between the voltage measured at a current instant and that measured at the previous instant, for each of the two secondary coils:

$$\Delta 1_t = V1_t - V1_{t-1}$$

$$\Delta 2_t = V2_t - V2_{t-1}$$

The following step E2 is the calculation of the sum of the two differences previously calculated:

$$S_t = \Delta 1_t + \Delta 2_t$$

The following step E3 is the updating of a health indicator IND, the function of which is to indicate a fault.

The indicator IND varies between two terminals, for example 0 and 100. One of the values, the value 100, indicates that the sensor is functioning normally, and the other value, the value 0, indicates that the sensor is faulty.

Step E3 modifies the value of the indicator IND between its terminals, according to the value of the sum $S_t$ calculated at the previous step. More precisely, the updating of the indicator comprises a modification of the value of the indicator according to the distance to zero of the sum previously calculated.

This sum is close to zero when the sensor is functioning normally and moves away from zero in the case of intermittent contact. Thus the value of the indicator changes at step E3 according to the normal functioning of the sensor or the existence of intermittent contact.

The indicator IND is initialised in the value 100. The indicator IND is highly decremented if the sum $S_t$ indicates a fault of the intermittent type, that is to say if the sum $S_t$ is distant from zero. The indicator IND is weakly incremented if the sum $S_t$ indicates a normal functioning of the sensor, that is to say if the sum $S_t$ is close to zero.

For example, the incrementation of the indicator IND is performed in accordance with an increment as depicted in the previously described FIG. 4.

The increment is applied to the indicator IND, while maintaining the latter between its terminals, that is to say the increment is not applied, or is only partially applied, if the indicator arrives at one of its terminals.

It is possible to require for the indicator to remain fixed at the value zero if it reaches it, so as to prevent a degraded LVDT sensor from being requalified subsequently as valid.

Naturally other variation laws for the incrementation of the indicator IND according to the sum $S_t$ are possible. The curve may be composed of linear segments in greater or lesser number. The curve may also be a bell curve or a Gaussian one.

The following step E4 is the determination of a validity status of the sensor. This determination is based on the comparison of the indicator IND with at least one predetermined threshold.

The comparison of the indicator preferably comprises the comparison with a first threshold and a second threshold, so that the change from a normal functioning state to a fault state is effected for a value different from that of the opposite change.

The indicator IND being initialised to zero, if it then remains above a first threshold, referred to as the low threshold, equaling for example 50, the sensor is declared to be functioning normally. If the indicator IND becomes less than the first threshold, a fault of the intermittent-contact type of the sensor is detected.

The indicator IND being below the first threshold, if it then remains below a second threshold, referred to as the high threshold, higher than the first threshold, equaling for example 90, the sensor remains declared faulty. If the indicator IND becomes higher than the second threshold, then the sensor is declared to be functioning normally.

This functioning in hysteresis makes it possible to avoid detecting a fault intermittently. Naturally, in a simplified mode, it is possible to use only one threshold, or in other words to choose a low threshold and a high threshold equal to each other.

If the sensor is declared to be functioning normally, then step E4 is followed by step E5, at which the time parameter is incremented by one step. Step E5 is followed by the previously described step E1, performed at the following time step.

If the sensor is declared to be affected by a fault of the intermittent contact type, then step E4 is followed by step E6, at which an alert is created in order to allocate an "invalid" label to the voltage values $V1_t$ and $V2_t$ measured at instant t. The computer 2 can thus reject these values for the subsequent processing operations.

At the following step E7, the time parameter is incremented by one step. Step E7 is followed by the previously described step E1, performed at the following time step.

The method according to the invention can be implemented as the measurements were acquired, or in a variant it can be implemented on a set of values previously measured and stored.

The invention can be implemented in addition to the known validity tests, such as electrical test, likelihood test and difference test.

The invention claimed is:

1. A method for monitoring a sensor of a linear variable differential transformer type, the method comprising:
    measuring, by the sensor of the linear variable differential transformer type, physical parameters associated with an aircraft engine or a turbojet, the sensor of the linear variable differential transformer type comprising a transformer that includes a primary circuit formed by a coil and two secondary circuits formed by coils and in each of which there is induced a voltage varying linearly according to a movement of a core;
    calculating, after the measuring of the physical parameters, and using processing circuitry, a first difference between voltages at terminals of a first circuit of the secondary circuits at a given instant and at a previous instant;
    calculating, after the measuring of the physical parameters, and using the processing circuitry, a second difference between voltages at terminals of a second circuit of the secondary circuits at the given instant and at the previous instant;
    calculating, using the processing circuitry, a sum of the first and the second differences previously calculated;
    modifying, using the processing circuitry, a value of an indicator indicating a fault of the sensor of the linear variable differential transformer type according to a distance to zero of the sum calculated by the calculating;
    comparing, using the processing circuitry, the value of the indicator, which indicates a fault of the sensor of the linear variable differential transformer type, with at least one predetermined threshold; and
    determining, using the processing circuitry, whether the sensor of the linear variable differential transformer type is functioning normally, based on the comparing.

2. The method according to claim 1, wherein the value of the indicator varies between two terminals, one of which indicates that the sensor of the linear variable differential transformer type is functioning normally and the other one of which indicates that the sensor of the linear variable differential transformer type is faulty.

3. The method according to claim 1, wherein the modifying of the value of the indicator comprises incrementing the value of the indicator when the sum is between −0.1 and +0.1 and decrementing the value of the indicator when the sum is not between −0.1 and +0.1.

4. The method according to claim 1, wherein the comparing of the value of the indicator comprises comparison of the value of the indicator with a first threshold and comparison of the value of the indicator with a second threshold, so that a change from a normal operating state to a fault state is effected for a value different from that of a change from the fault state to the normal operating state.

5. A non-transitory computer readable medium including a computer program comprising instructions for executing the method according to claim 1 when the computer program is executed by a computer.

6. A device for monitoring a sensor of linear variable differential transformer type, the device comprising:
processing circuitry configured to
receive, from the sensor of the linear variable differential transformer type, measurements of physical parameters associated with an aircraft engine or a turbojet, the sensor of the linear variable differential transformer type comprising a transformer that includes a primary circuit formed by a coil and two secondary circuits formed by coils and in each of which there is induced a voltage varying linearly according to a movement of a core,
calculate, after receiving the measurements of the physical parameters, a first difference between voltages at terminals of a first circuit of the secondary circuits at a given instant and at a previous instant,
calculate, after receiving the measurements of the physical parameters, a second difference between voltages at terminals of a second circuit of the secondary circuits at the given instant and at the previous instant,
calculate a sum of the first and the second differences previously calculated,
modify a value of an indicator indicating a fault of the sensor of the linear variable differential transformer type according to a distance to zero of the sum,
compare the value of the indicator, which indicates a fault of the sensor of the linear variable differential transformer type, with at least one predetermined threshold; and
determine whether the sensor of the linear variable differential transformer type is functioning normally, based on the comparing.

7. A measuring chain integrating a sensor of linear variable differential transformer type, the measuring chain comprising:
the sensor of linear variable differential transformer type, which measures physical parameters associated with an aircraft engine or a turbojet and includes
a first secondary circuit in which there is induced a voltage varying linearly according to a movement of a core, and
a second secondary circuit in which there is induced a voltage varying linearly according to the movement of the core; and
a monitoring device including processing circuitry configured to
calculate, after the sensor of linear variable differential transformer type measures the physical parameters, a first difference between voltages at terminals of the first secondary circuit at a given instant and at a previous instant,
calculate, after the sensor of linear variable differential transformer type measures the physical parameters, a second difference between voltages at terminals of the second secondary circuit at the given instant and at the previous instant,
calculate a sum of the first and the second differences previously calculated,
modify a value of an indicator indicating a fault of the sensor of the linear variable differential transformer type according to a distance to zero of the sum,
compare the value of the indicator, which indicates a fault of the sensor of the linear variable differential transformer type, with at least one predetermined threshold; and
determine whether the sensor of the linear variable differential transformer type is functioning normally, based on the comparing.

* * * * *